United States Patent [19]
Berry

[11] 3,955,106
[45] May 4, 1976

[54] MULTIPLE DE-Q-ING CIRCUIT FOR A MOVING TARGET INDICATOR RADAR SYSTEM

[75] Inventor: Johnny L. Berry, Plano, Tex.

[73] Assignee: Texas Instruments Incorporated, Dallas, Tex.

[22] Filed: Dec. 3, 1973

[21] Appl. No.: 421,298

[52] U.S. Cl. .............................. 307/268; 307/264; 328/67; 328/147
[51] Int. Cl.² ........................................ H03K 5/01
[58] Field of Search ............. 328/67, 168, 171–173, 328/147; 307/264, 268

[56] References Cited
UNITED STATES PATENTS

| | | | |
|---|---|---|---|
| 3,119,968 | 1/1964 | Schonberg | 328/67 |
| 3,139,585 | 6/1964 | Ross et al. | 328/67 X |
| 3,363,184 | 1/1968 | Smith | 328/67 X |
| 3,716,798 | 2/1973 | O'Loughlin | 328/67 |

*Primary Examiner*—John Zazworsky
*Attorney, Agent, or Firm*—Harold Levine; Rene' E. Grossman; Alva H. Bandy

[57] ABSTRACT

The specification discloses a semiconductor magnetic modulator for use with a moving target indicator radar transmitter and which utilizes a plurality of charging capacitors for receiving charging current from a direct current power source and discharging in parallel. Silicon controlled rectifiers are connected to each of the charging capacitors and are operable to triggering signals to cause said capacitors to discharge at a predetermined time. A de-Q-ing circuit is connected to each of the charging capacitors in order to sense the voltage level across the capacitors and to dissipate voltage above a predetermined threshold level. The charging capacitors discharge through a hold-off inductor and through a switching transformer to a pulse forming network including a second charging capacitor. Compression occurs in the pulse charging network and a resulting high power modulator pulse is applied from the network to a klystron power tube in a moving target indicator radar transmitter. The power supply for the modulator utilizes an SCR bridge A.C. to D.C. convertor. An automatic delay circuit is also provided in order to provide a stable radar modulator trigger signal to the modulator circuit.

5 Claims, 6 Drawing Figures

MULTIPLE DE-Q-ING CIRCUIT FOR A MOVING TARGET INDICATOR RADAR SYSTEM

FIELD OF THE INVENTION

This invention relates to radar modulators, and more particularly relates to a semiconductor magnetic modulator for use with moving target indicator radar.

THE PRIOR ART

A wide variety of radar transmitters for moving target indicator (MTI) radar have heretofore been developed. A common amplifier utilized in MTI transmitters is the klystron amplifier which is pulsed by a modulator circuit. Various types of modulators have been heretofore utilized, such as the directly switched line modulator, the hard tube modulator and the saturable-reacter modulator. For description of the operation and construction of MTI radar and particularly for description of various types of amplifying tubes and modulators, reference is made to Chapter 6 of "Introduction to Radar Systems" by Merrill I. Skolnick, McGraw-Hill Book Company, published 1962.

Although magnetic pulse generators have important advantages over generators utilizing vacuum and gas tubes with respect to mechanical ruggedness and life expectancy, such magnetic pulse generators have not been heretofore widely used in radar applications due to their relatively low efficiency, high weight and output pulse jitter. More recently, semiconductor switches have been combined with magnetic pulse generators in order to reduce prior problems in efficiency, size and jitter.

A typical circuit includes a linear inductor for switching a D.C. input, the inductor being controlled by start and stop silicon controlled rectifiers (SCRs). A capacitor charges up with voltage from the D.C. input until it reaches a predetermined level, after which the stop SCR is rendered conductive in order to terminate the flow of current to the capacitor. The voltage across the charging capacitor is then applied to a pulse forming network by operation of a main trigger SCR, the pulse forming network applying a higher pulse to the klystron tube. A detailed description of the construction and operation of such a semiconductor-magnetic pulse generator is found in the publication "A High-Power Semiconductor-Magnetic Pulse-Generator Circuit", M.I.T. Report ESL-R-246 M.I.T. Project DSR 9979, published October 1965 by the Electronic Systems Laboratory of the Massachusetts Institute of Technology, Cambridge, Mass.

However, an MTI radar transmitter utilizing a semiconductor-magentic modulator has not been heretofore developed which provides satisfactory reliability and performance and yet which may be economically constructed. Moreover, previously developed semiconductor-magnetic modulators have not generally included provisions for maintaining operation of the system in case of the occurrence of a fault in one or more of the semiconductor switching devices. Moreover, such previously developed modulators have often required relatively complex and therefore expensive power supplies, as well as expensive high performance SCRs and the like. Prior modulator circuits have also sometimes had problems in short and long term jitter and the total time delay through the modulator has tended to vary during long term operation.

SUMMARY OF THE INVENTION

In accordance with the present invention, a semiconductor-magnetic modulator system is provided for use with an MTI radar transmitter and which substantially eliminates or reduces problems noted above with respect to previously developed systems.

In accordance with a more specific aspect of the invention, a semiconductor magnetic modulator for a moving target indicator radar transmitter includes a source of direct current power. A plurality of charging capacitors are each connected to receive charging current from the direct current power source. Normally nonconductive silicon controlled rectifiers are each connected to a terminal of one of the capacitors and are operable to be rendered conductive by a triggering signal in order to cause the capacitors to discharge in parallel. A de-Q-ing circuit is connected to each of the capacitors in order to sense the voltage level across the capacitors and to dissipate excess energy when the voltage reaches a predetermined threshold value. A fuse is provided to electrically disconnect each of the capacitors from the modulator upon the occurrence of an electrical fault in the circuitry adjacent the capacitors. A hold-off inductor includes first windings connected to terminals of a first plurality of the charging capacitors and second windings connected to terminals of a second plurality of the capacitors. Air core inductances are connected across the first and second windings of the hold-off inductor to provide a path for SCR priming current. A pulse forming network is provided to receive voltage pulses from the charging capacitor. A magnetic diode or diode inductor is connected to short the pulse forming network during charging of the capacitors.

In accordance with another aspect of the invention, an automatic variable time delay circuit is provided for a radar modulator trigger signal. The time delay circuit includes circuitry responsive to a modulator trigger signal for initiating a pair of signal pulses. Circuitry is responsive to a video trigger signal for terminating one of the signal pulses. Circuitry is also responsive to an rf trigger signal for terminating the other of the signal pulses. Circuitry compares the duration of the pair of signal pulses and generates an error signal proportional to the difference in duration of the signal pulses. Circuitry is responsive to the error signal for applying a delay to the modulator trigger signal which is proportional to variations in the video trigger signal.

In accordance with yet another aspect of the invention, a de-Q-ing system is provided to reduce jitter in a radar modulator which includes charging capacitance and includes circuitry for sensing the charging waveform of the capacitance. Circuitry compares the voltage level of the charging waveform with a predetermined threshold level. Circuitry is then responsive to the comparing circuitry for terminating further charging of the capacitance when the charging waveform exceeds the threshold level.

In a more specific aspect of the de-Q-ing circuit, circuitry is provided to sense the charging waveform of the charging capacitance of a radar modulator operable in the stagger mode. A plurality of comparator channels are each connected to receive the sensed charging waveform and to receive a reference voltage of a different magnitude. Each of the comparator channels generates an output signal when the charging waveform exceeds the reference voltage. Normally disabled gates are connected to each output of the comparator channels. Circuitry is synchronized with the stagger mode operation of the modulator for sequentially disabling the gates. Circuitry is connected to the output of the gates for preventing charging of the capacitance above the predetermined reference voltages.

In accordance with yet another aspect of the invention, a radar modulator includes terminals for receiving three phase alternating current. A three phase bridge circuit is provided which includes three pairs of silicon controlled rectifiers each connected to one of the three phases. A plurality of trigger circuits are each operable to fire one of the rectifiers, each of the trigger circuits being responsive to one of the three phases to provide firing control for one of the rectifiers. Output terminals are connected across the bridge circuit to provide a direct current voltage. A charging capacitance is connected to receive the voltage in order to charge to the desired level. Circuitry transfers the charge on the capacitance through a step up transformer. A pulse transforming network is provided to shape the stepped up charge. A radar power tube is connected to receive the output from the pulse forming network.

DESCRIPTION OF THE DRAWINGS

For a more complete understanding of the present invention and for further objects and advantages thereof, reference is now made to the following description taken in conjunction with the accompanying drawings, in which.

DESCRIPTION OF THE PREFERRED EMBODIMENT

Figure 1:
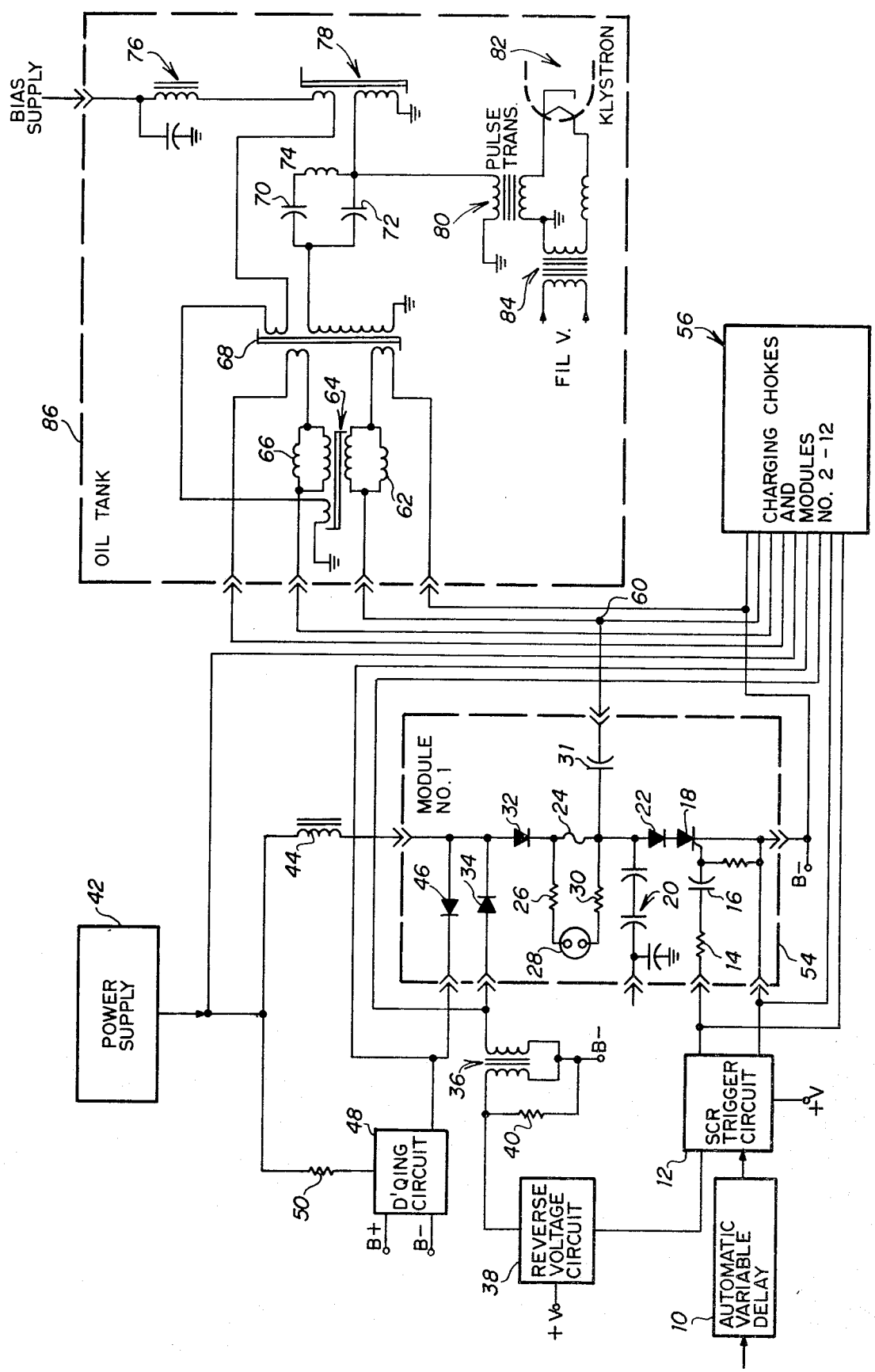
FIG. 1 is a schematic diagram of the semiconductor magnetic modulator of the invention.

FIG. 1 illustrates a block diagram of the semiconductor magnetic modulator of the present invention. The modulator pulses a klystron amplifier in the well known manner in order to provide amplification of rf pulses generated in moving-target-indication (MTI) radar such as air traffic control radar.

Referring to FIG. 1, a triggering signal from a modulator control circuit is applied to an automatic variable delay 10 which compensates for long term variations in the delay provided by the modulator system in order to provide an extremely stable modulated output pulse. The output of the delay circuit 10 is applied to SCR trigger circuit 12 which comprises a blocking oscillator for controlling the control semiconductor switches of the present modulator circuit. The output of the trigger circuits 12 are applied to twelve charging capacitor modules, only one of which is shown in detail.

Figure 4:
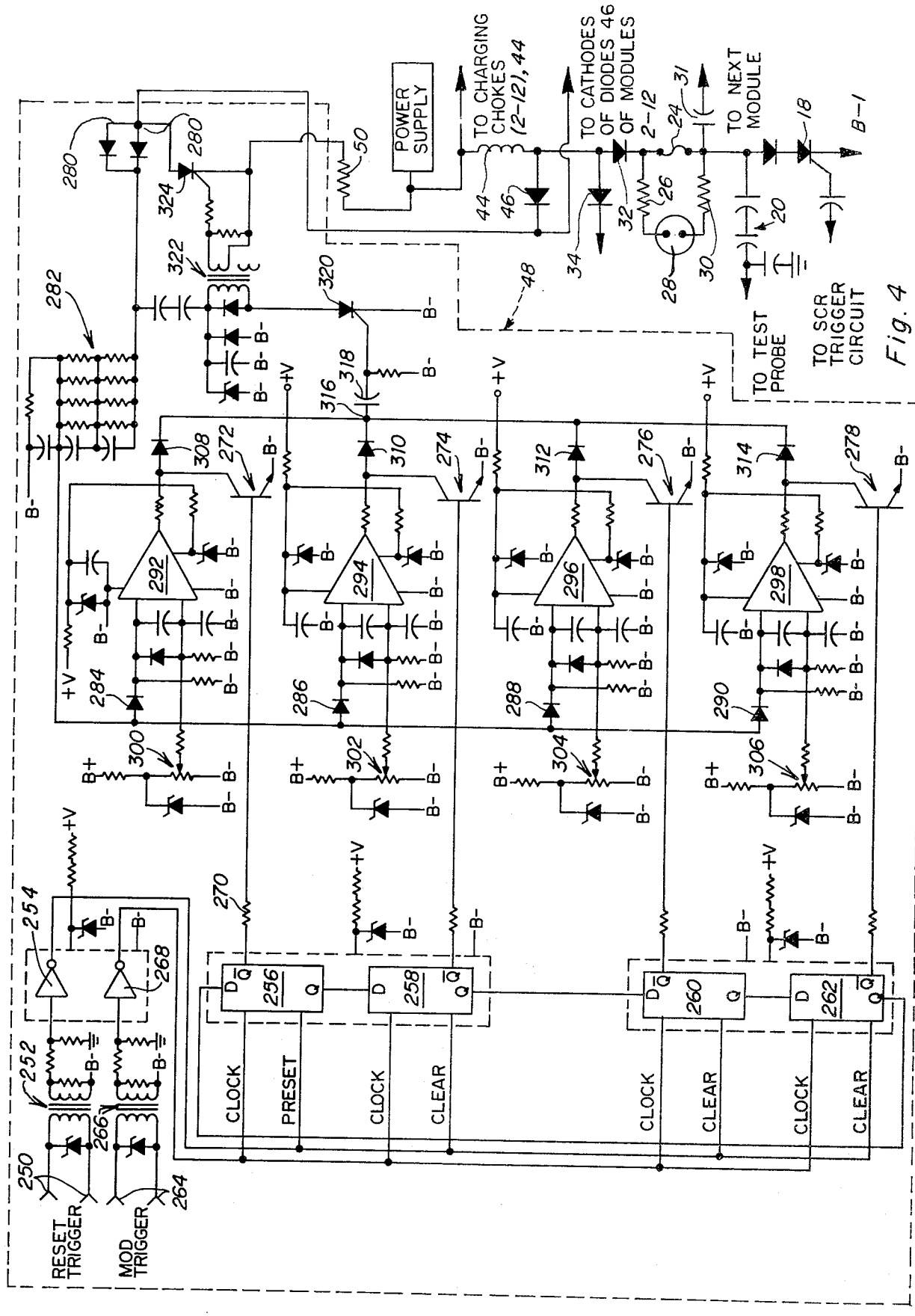
FIG. 4 is a schematic diagram of the d'quing circuit of the invention.

The trigger signals are applied to module No. 1 through a resistor 14 and capacitor 16 to the trigger electrode of a silicon controlled rectifier (SCR) 18. The cathode of the diode 22 is connected to the anode of the SCR 18. The anode of diode 22 is connected to a junction of a test probe 20, a fuse 24 and resistor 30. The resistor 30 is coupled to a neon bulb 28. Neon bulb 28 is coupled to neon bulb 28. Bulb 28 is coupled through a resistor 26 to the junction of fuse 24 and cathode of diode 32. Bulb 28 is tied through resistor 30 to an energy storage capacitor 31. Diode 32 is connected to the junction of the cathode of a diode 34, cathode of diode 46 and choke 44. The anode of diode 34 is coupled through a linear inductor 36 to a reverse voltage circuit 38. A resistor 40 is connected across linear inductor 36 to a source of negative voltage. A power supply 42 supplies a regulated D.C. voltage through a charging choke 44 which is connected to the anode of diode 32. Choke 44 is also connected to a de-Q-ing circuit 48 and through a sensing point diode 46 to charging waveform terminals 280 (FIG. 4). De-Q-ing circuit 48 is connected through a de-Q-ing resistor 50 to the power supply 42 (FIG. 1).

The SCR switch 18 and energy storage capacitor 31, and the associated circuitry, is contained in a plug-in module No. 1 identified by the dotted line 54. Preferably, this module will comprise a printed circuit board which may be easily inserted into a connector set within a cabinet. An important aspect of the present invention is then eleven additional charging chokes and modules generally identified by the numeral 56 are connected in parallel in the present system. Power is applied through the charging chokes to the various modules from the power supply 42. The de-Q-ing circuit 48 and the linear transformer 36 are connected to the modules 56, as are trigger pulses from the SCR trigger circuits 12. Each of the modules number 2–12 are constructed identically to module No. 1 and the modules are thus connected in parallel to provide the desired switching operation while allowing the use of economical SCRs. In addition, the provision of fuses within each of the twelve modules enables the system to maintain operation with only a slight reduction in power in case of a fault of one or more of the plug-in modules.

The output from the energy storage capacitor 31 in module No. 1 and from the other energy storing capacitors from five of the additional modules 56 are applied to a summing point 60 and are applied to an air core inductor 62 connected across a hold-off inductor 64. Similarly, the outputs from the six remaining energy storage capacitors in the modules 7–12 are applied to an air core inductor 66 connected across the opposite side of the hold-off inductor 64. The inductors 62–66 are connected to a switching transformer 68, the secondary of which is applied through a pulse forming network comprising capacitors 70 and 72 and an inductor 74. Bias current is applied through a bias choke 76 and through a magnetic diode or diode inductor 78 to the pulse forming network. The bias choke 76 also provides bias to the hold-off inductor 64 and to the switching transformer 68.

The output of the pulse forming network is applied through a pulse transformer 80 to the control electrodes of a klystron tube 82 in order to control switching of the klystron. A filament voltage is applied through a transformer 84 to provide filament power to the klystron. The major magnetic components of the system including the inductor 64, switching transformer 68, bias choke 76 and magnetic diode 78 are contained within an oil tank 86 in order to provide insulation and cooling. The pulse transformer 80, the filament transformer 84 and the klystron cathode are also contained in the oil tank.

The operation of the system shown in FIG. 1 is somewhat similar to the operation of the pulse generator described with respect to FIG. 1,3 in the aforementioned article entitled "A High Power Semiconductor-Magnetic Pulse-Generator Circuit" by Coate. Basically, energy is drawn from the power supply 42 and is applied through the charging choke 44 and diode 32 in order to charge the twelve charging capacitors 31 connected to discharge in parallel. During this time, SCR 18 is nonconductive.

The diode 22 is utilized only when the SCR in a module fails and the fuse 24 is blown. Upon such an occurrence, diode 22 isolates capacitor 31. If SCR 18 fails in the shortage mode, fuse 24 opens and disconnects the shortage path between the power supply and ground. Nevertheless, all modules are connected in parallel. Thus without diode 22 in the module, when the other eleven modules fire, their output would be across the capacitor 31. When fuse 24 is blown, the neon bulb changes illumination states to indicate a blown fuse.

Upon the occurrence of a failure of one of the major components of the system, such as the SCR 18, the fuse 24 in the particular module blows and therefore disconnects the particular module from the power supply and from the remaining parallel connecting modules by passing the power for that particular module directly to the De-Q-ing circuit 48. Thus, the system continues operation with slight decrease in power level. This aspect of the invention enables the use of relatively inexpensive SCRs while providing a high degree of reliability to the system.

The diode 46 connects the system with the de-Q-ing circuit 48 which provides a very stable pulse generation. As will be subsequently described in greater detail, the de-Q-ing circuit 48 senses the voltage level across the capacitor 31 through the diode 46. When the voltage of capacitor 31 reaches the predetermined level the appropriate Schmidt trigger of Schmidt triggers 292–298 of the sensor circuits produces a trigger signal and, SCR 324 (FIG. 4) is switched on and connects the high voltage terminal of inductor 44 through resistor 50 to its low voltage terminal and energy stored in the inductor is dissipated in resistor 50 instead of being used to charge capacitor 31. This substantially reduces short term jitter of the modulator system.

When the capacitors 31 are charged to the desired voltage, each SCR 18 is turned on by a triggering pulse to thereby transfer the charge across capacitors 31 to the capacitor 70 through the saturated inductance of hold-off inductor 64. Inductor 64 operates to enable the use of the parallel connected SCRs which ordinarily require longer switching times than are utilized in the circuit.

For reliable high current SCR 18 operation, the high current surge must be limited to a relatively low value until the electron flow through the SCR junction has time to equally distribute itself across the junction. Otherwise, hot spots develop and destroy the silicon junction. The action of inductor 64 is very nonlinear and goes from a very high value of inductance (when $\mu$ is equal to 22,000) to a very low value in saturation (when $\mu$ is equal to 2). This variable inductance action is automatic with the current surge and acts to hold off the peak current for about 7 microseconds; this provides protection for the SCR 18. In addition, a very linear inductor (66 and 62) built on an air core is connected in parallel with inductor 64. Initially, the inductance of 64 is too high to begin current through the 12 SCR's (18) so priming current is supplied through inductors 66 and 62 to begin the process of equally spreading the current in the SCR junction. After the hold-off time provided by inductor 64, the capacitors 31 are effectively connected to the pulse forming network and a resonant circuit is effectively created to cause energy to flow from the capacitors 31. The transformer 68 is unsaturated and functions as an ordinary step-up transformer during this process.

The transferred charge is thus delayed by the time required for saturation of inductor 64. When the capacitor 70 is completely charged, the transformer 68 saturates and the capacitor 70 discharges through the secondary of transformer 68, the pulse forming network and through the transformer 80 to the klystron tube. The discharge of capacitor 70 is more rapid than the charge and thus pulse compression occurs.

The choke 76 provides isolation to the modulator circuit from the bias supply. The magnetic diode 78 transfers the charging current around the pulse transformer during charging of the capacitor 70, and is then switched to provide an effective open circuit during transfer of the pulse through the pulse forming network.

Figure 2:
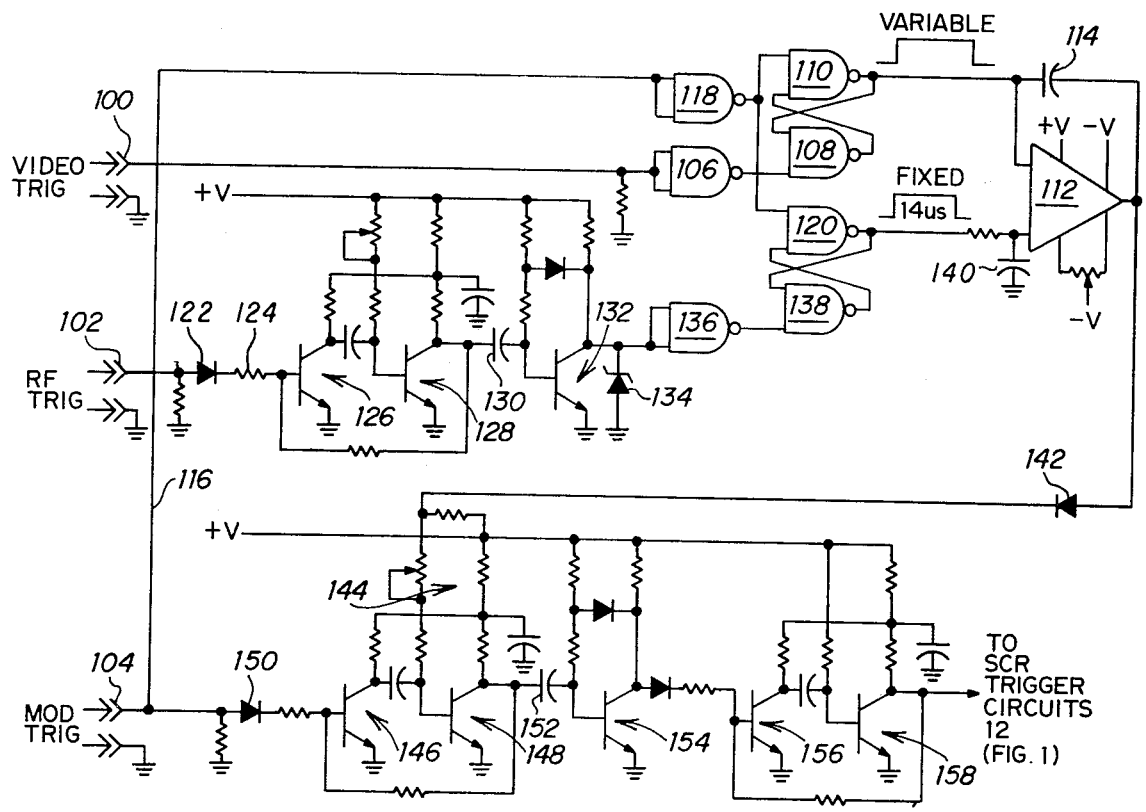
FIG. 2 is a schematic diagram of the variable delay circuit shown in FIG. 1.

FIG. 2 illustrates in schematic detail the automatic variable delay 10 shown in FIG. 1. A video trigger is applied to terminal 100. The video trigger is a sample of the klystron 82 cathode voltage to provide an indication of the variance of the operation of the klystron due to heat or higher level changes. An rf trigger signal is applied at terminal 102 which comprises the $t_0$ trigger pulse plus 14 microseconds during normal operation. The modulator trigger signal $t_0$ is applied to the circuit at terminal 104. The video trigger is applied to common inputs of a NAND gate 106, the output of which is applied to a NAND gate 108 interconnected in a latch configuration with a NAND gate 110. The output of gate 110 is applied to an input of an integrator 112. A capacitor 114 is connected across the integrator 112. The modulator trigger signal is applied from terminal 104 through a lead 116 to the common inputs of a NAND gate 118. The output of gate 118 is tied to an input of gate 110 and is also connected to an input of a NAND gate 120.

The rf trigger is applied to terminal 102 and is directed through a diode 122 and resistor 124 to the base of a transistor 126. Transistor 126 is interconnected in a one shot multivibrator configuration with a transistor 128. The output of the multivibrator configuration is applied through a capacitance 130 to the base of a transistor 132. Transistor 132 is connected with associated resistor and diode circuitry to form a pulse forming network. The output of the pulse forming network is connected in parallel with a zener diode 134 and is connected to common inputs of a NAND gate 136. The output of gate 136 is applied to an input of a NAND gate 138 which is connected in a latch configuration with gate 120. The output of the latch configuration is applied to the parallel capacitor 140 and also is applied to the second input of the integrator 112.

The output from the integrator 112 is applied through a diode 142 and is applied through a resistive network 144 as a control voltage for a voltage responsive multivibrator comprising transistors 146 and 148. The modulator trigger signal is applied through terminal 104 to a diode 150 to trigger the multivibrator comprising transistors 146 and 148. The "on" time for the one shot multivibrator is normally 4 microseconds, but the time interval is variable in dependence with the magnitude of the voltage applied via diode 142 and the resistive network 144.

The resulting output signal from the multivibrator is applied through a capacitor 152 to the base of a transistor 154. Transistor 154 and its associated circuitry comprise a pulse forming network which provides a delay to the signal, as the output from the multivibrator triggers the pulse forming network by the trailing edge. The resulting delayed pulse is applied to the base of a transistor 156, the output of which is tied to the base of a transistor 158. The collector of transistor 158 provides an amplified variable delay signal to the SCR trigger circuits 12 previously described in FIG. 1.

In operation of the automatic delay circuit, the $t_0$ signal is applied to terminal 104 and sets the leading edge of a pulse applied to the latch comprising gates 108 and 110 and which is applied to the integrator 112. The video trigger applied to terminal 100 is a sample from the cathode of the klystron and thus may vary during operation. The video trigger applied to terminal 100 sets the trailing edge of the pulse applied to integrator 112. An important aspect of the invention is that the $t_0$ modulator trigger is also applied from the output of gate 118 to initiate the leading edge of a fixed 14 microsecond pulse applied to the second input of the integrator 112. The fixed pulse applied to integrator 112 is terminated when the rf trigger is applied to terminal 102. The termination of the pulse is due to the operation of the multivibrator comprising transistors 126 and 128 and the pulse forming network which applies a pulse through gates 138 and 120.

The integrator 112 does not generate an output as long as both its inputs have pulses thereon. If the pulses applied to the inputs of the integrator 112 are identical in length, no output is generated. However, if the length of the pulses applied to the input of the integrator 112 are different, the output of the integrator integrates up or down and thus provides a variable voltage to the voltage responsive multivibrator comprising transistors 146 and 148. The resulting pulse from the variable voltage multivibrator is then delayed by an amount corresponding to the difference in the length of the pulses applied to the integrator 112. This delay is added to the modulator trigger $t_0$ in order to maintain a constant modulator trigger to accomodate long term jitter caused by the heating up of the klystron or the like.

Figure 3:
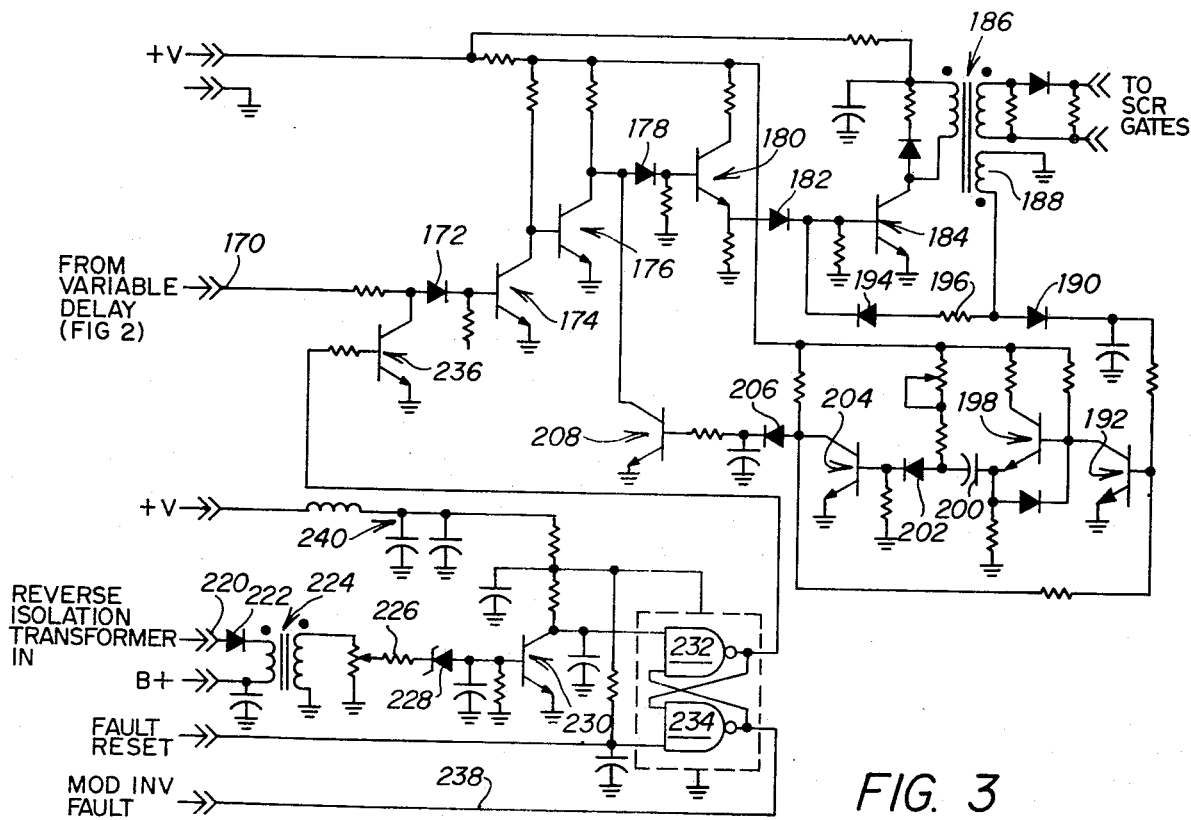
FIG. 3 is a schematic diagram of the SCR triggering circuit of the invention.

FIG. 3 illustrates the SCR trigger circuit 12 previously shown in FIG. 1. This circuit prevents false triggering and also senses inverse overloads in order to turn the transmitter off and prevent damage to the circuitry.

The properly delayed signal from the automatic variable delay circuit described in FIG. 2 is applied to terminal 170 and through a diode 172 to the base of a transistor 174. The collector of transistor 174 is connected to the base of a transistor 176 which applies an output through a diode 178 to the base of a transistor 180. The emitter of transistor 180 is applied through a diode 182 to the base of a transistor 184. The output of transistor 184 is connected to one side of a transformer 186 which applies gating signals to the SCR switches in the twelve modules shown in FIG. 1.

A winding 188 of the transformer 186 applies a portion of the output signal through a diode 190 to the base of a transistor 192. The cathode of diode 182 is applied through a diode 194 and resistor 196 to the anode or diode 190. The collector of transistor 192 is tied to the base of a transistor 198; the emitter is coupled through a capacitor 200 and a diode 202 to the base of a transistor 204. The output of transistor 204 is applied through a diode 206 to the base of a transistor 208 which serves to lock off the circuit in order to prevent undesirable premature triggering.

The output of transformer 36 is connected to a terminal 220 and is coupled through a diode 222 to an isolation transformer 224. The output of the transformer is applied through a variable resistance 226 and a zener diode 228 to the base of a transistor 230. The output of the transistor is applied to an input of a NAND gate 232 which is connected in a latch configuration with a NAND gate 234. The output of gate 232 is applied to the base of a transistor 236, the collector of which is connected to the anode of diode 172. The output of gate 234 is connected to a lead 238 to indicate a modulator fault. Bias for the circuitry is applied from an L-C network 240.

In operation of the modulator triggering circuit shown in FIG. 3, the delayed trigger signal from the automatic variable delay 10 is applied to terminal 170 and is properly amplified and shaped by transistors 174, 176, 180 and 184. The trigger pulses are then applied through the transformer 186 to the switching SCRs in the twelve modules shown in FIG. 1. Feedback from the triggering signals is applied from the winding 188 through the amplifying transistors 192, 198, 204 and 208 to the collector of transistor 176. Transistor 208 becomes conductive in order to lock off the circuit after generation of a triggering signal to thereby prevent premature triggering of the modulator by a subsequent signal. After a predetermined time, transistor 208 becomes nonconductive and the channel is again opened to transmit modulator triggering signals through transistors 180 and 184. The present invention system circuit also provides protection to the circuit in case of a malfunction such as a short in the klystron elements.

During normal operation, the gate 232 presents a logic low to the base of transistor 236 and transistor 236 is thus normally nonconductive. However, in case of occurrence of a short in the klystron filaments, the short is sensed through the isolation transformer 224 and gates 232 and 234 are flipped in order to energize transistor 236, to short the triggering input supplied to terminal 170 and prevent further triggering of the modulator. When the fault is corrected, a fault reset signal may be applied to gate 234 to again flip the latched gates 232 and 234 to again render transistor 236 nonconductive.

FIG. 4 illustrates in schematic detail the de-Q-ing circuit 48 previously shown in block form in FIG. 1. A reset trigger is applied to terminal 250 and is utilized to synchronize stagger operation of the system. If the system is operated on a fixed pulse repetition frequency (PRF), only a single stage de-Q-ing circuit would be required. However, the present system is generally operated in a stagger mode, wherein four different PRFs are sequentially switched between each modulator trigger in order to eliminate blind speeds of the radar system. For a description of the stagger mode of operation, reference is made to Section 4.2, pages 129–131, of "Introduction to Radar Systems" by Skolnik, previously noted.

Due to the stagger operation of the present system, four de-Q-ing circuits are required in order to provide de-Q-ing for each stagger mode. Each of the circuits is fired in a staggered manner. A reset trigger is applied to terminals 250 in order to synchronize the stagger operation. One reset trigger signal is generated each four modulator triggers in order to provide synchronization. The reset triggers are applied through a transformer 252 and through an invertor 254 to the preset input of a shift register 256. The reset trigger is also applied to the clear terminals of shift registers 258, 260 and 262, which may comprise for example SN5474 registers.

The modulator trigger signal is applied to terminals 264 and through a transformer 266 and an invertor 268 to the clock inputs of the registers 256–262. The output at the $\bar{Q}$ output register 256 is applied through a resistor 270 to the base of a transistor 272.

The output of register 258 is applied to the base of a transistor 274. Similarly, the $\bar{Q}$ output of register 260 is applied to the base of a transistor 276 and the $\bar{Q}$ output of register 262 is applied to the base of a transistor 278. An input which is representative of the voltage of the charging waveform of the capacitors 31 is applied to terminals 280. This input voltage is applied through a resistive network 282 and through diodes 284, 286, 288 and 290 to inputs of Schmidt triggers 292, 294, 296 and 298. The second input to the Schmidt triggers 292–298 is biased by bias voltage applied to divider network 300–306.

The outputs of the Schmidt triggers 292–298 are applied through diodes 308, 310, 312 and 314, the outputs of which are tied to point 316. The outputs are then applied through a capacitor 318 to the trigger electrode of an SCR 320. The anode of the SCR 320 is applied through a transformer 322 to the trigger electrode of an SCR 324. Terminals 326 across the SCR 324 are tied to the dumping resistor 50 shown in FIG. 1.

In operation of the de-Q-ing circuit shown in FIG. 4, the voltage from the charging capacitors in the twelve parallel modules shown in FIG. 1 are applied to terminals 280 and through the resistive network 282 to the input of the trigger 292. Each of the triggers 292–298 is adjusted to a different predetermined level in order to generate an output signal only when the combined voltage from the charging capacitors reaches a predetermined threshold level. Shift registers 256–262 are clocked by the reset trigger signal applied to terminals 250 and the modulator trigger signal applied to terminals 264. The registers 256–262 thus sequentially energize the triggers 292–298 in synchronism with the stagger operation of the modulator.

The register 256 thus generates an energizing signal to the base of transistor 272 which allows the output from trigger 292 to be applied through the capacitor 318 to energize the SCR 320. Excess voltage above the predetermined threshold is then applied through the transformer 322 to energize SCR 324 to connect the circuit to the dumping resistor 50 shown in FIG. 1 in order to dissipate energy above the predetermined threshold. Subsequently, register 258 would energize transistor 274 in order to pass the output from trigger 294 to trigger the SCR 320. Operation of the subsequent stages operates in the same manner. The present de-Q-ing system thus operates in conjunction with the present modulator system while operating in the staggered mode in order to eliminate time and amplitude jitter which stagger mode tends to introduce into the system.

Figure 5:
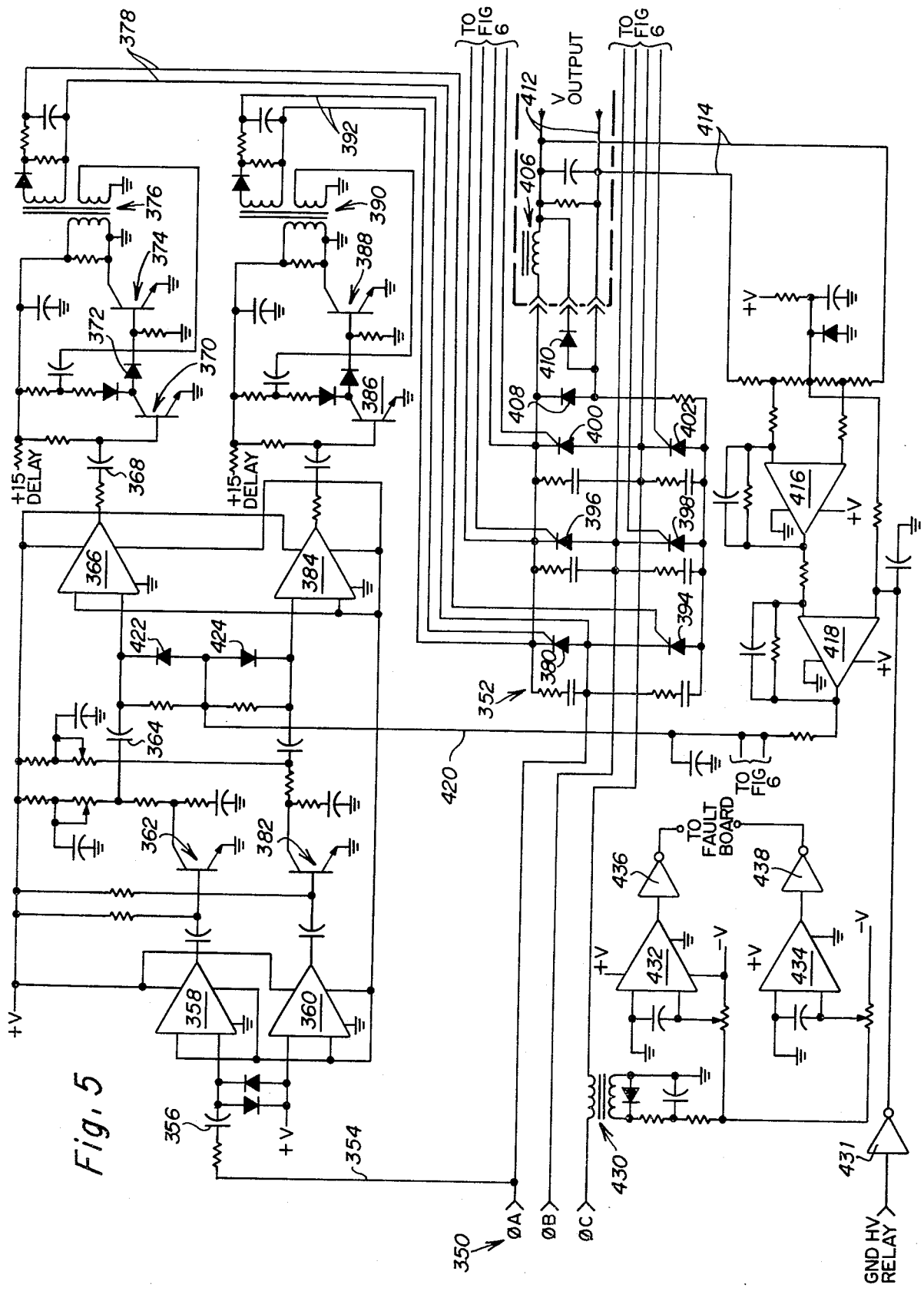
FIGS. 5 and 6 are schematic diagrams of the power supply for the present magnetic modulator.
Figure 6:
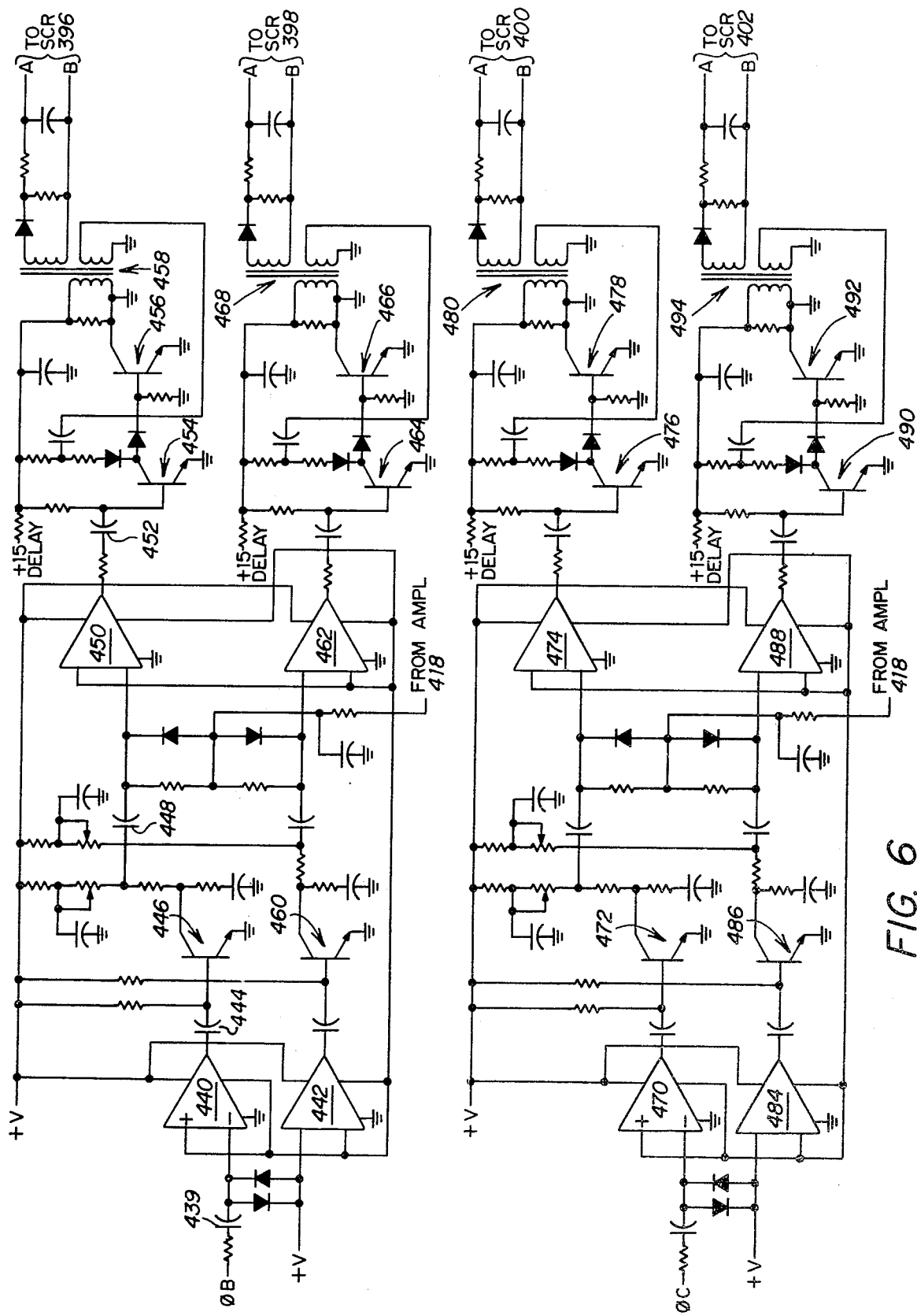

FIGS. 5 and 6 illustrate the power supply and SCR gating circuitry of the present invention. A conventional three phase power supply is connected to terminals 350 and is applied to an SCR bridge network 352 which comprises six SCRs controlled by six SCR gating circuit channels. The first two channels are connected to phase $\phi$A via a lead 354 and is connected through a capacitor 356 to the inputs of Schmidt triggers 358 and 360. The outputs of the Schmidt trigger 358 is applied to the base of a transistor 362, the collector of which is connected through a capacitor 364 to the negative input of a Schmidt trigger 366. The output of trigger 366 is applied through a capacitor 368 to the base of a transistor 370. The collector of transistor 370 is applied through a diode 372 to the base of a transistor 374. The collector of transistor 374 is connected to one side of a transformer 376. The output of transformer 376 is applied via lead 378 to the gate electrode of an SCR 380. Transistors 370 and 374, along with transformer 376 and associated circuitry, comprise an oscillator circuit.

The output of trigger 360 is connected to a second control channel including a transistor 382, the output of which is applied to a Schmidt trigger 384. The output of trigger 384 is applied to an oscillator including transistors 386 and 388 and the transformer 390. The output of transformer 390 is applied via leads 392 to the gate electrode of an SCR 394.

SCRs 396, 398, 400 and 402 are connected to four additional gating channels shown in FIG. 6. The output of the SCR control network is applied through a filter choke 406 and diodes 408 and 410 and associated circuitry to provide a desired voltage output at terminals 412 for operation of the modulator circuitry previously described. For example, in one embodiment of the invention, the output of terminals 412 comprises 250 volts at 30 amps. The output of the power supply circuitry is sensed via lead 414 and is applied through suitable voltage dividing and biasing circuitry to the inputs of an operational amplifier 416, the output of which is applied to an input of an operational amplifier 418. The output of amplifier 418 is applied via lead 420 to the commonly connected anodes of diodes 422 and 424 connected across the negative inputs of the Schmidt triggers 366 and 384. The output of the amplifier 418 thus serves to advance or retard the SCR cycle triggers in dependence upon the amplifier output. An output is applied via invertor 431 from an operable relay in order to control the operation of the amplifier 418 as is desired.

The current through phase $\phi$C applied to the system is sensed by a current transformer 430 and is applied through associated circuitry to the input of Schmidt triggers 432 and 434. The output of the triggers are applied through invertors 436 and 438 to a fault board to indicate the occurrence of an overcurrent or an undercurrent. The circuit automatically turns off the power supply upon the occurrence of a fault and then turns the system back on for a predetermined number of faults. Automatic reset will preferably be accomplished for a predetermined number of times prior to completely terminating operation of the power supply. Similar circuits may be applied to the fault board to indicate the occurrence of under and over voltage with the use of suitable voltage sensing circuit.

FIG. 6 illustrates the remaining four channels for control of the SCRs 396–402. The current from phase $\phi$B applied to one of the terminals 350 is applied through capacitor 439 to inputs of Schmidt triggers 440 and 442. The output of trigger 440 is applied through a capacitor 444 to the base of a transistor 446. The collector of transistor 446 is applied through a capacitor 448 to an input of a Schmidt trigger 450. The output of trigger 450 is applied through a capacitor 452 to the base of transistor 454, the output of which is applied to the base of a transistor 456. The collector of transistor 456 is tied to one side of a transformer 458, the output of which is applied through associated circuitry to control the operation of SCR 396 shown in FIG. 5.

The fourth SCR gate control channel includes the output of trigger 442 which is applied to the base of transistor 460 and to the input of a Schmidt trigger 462. The output of trigger 462 is coupled through transistors 464 and 466 and through a transformer 468 to control the operation of SCR 398. In a similar manner, phase $\phi C$ applied to terminal 350 is applied through a Schmidt trigger 470 and through a transistor 472 to an input of a Schmidt trigger 474. The output of trigger 474 is coupled through transistors 476 and 478 to a transformer 480. The transformer 480 couples the oscillating gate control signals to the SCR 400 for control thereof.

Phase $\phi C$ is also applied to a Schmidt trigger 484 which controls an amplifier 486. The collector of amplifier 486 is coupled to a Schmidt trigger 488, the output of which is applied to transistors 490 and 492. The collector of transistor 492 is applied to a transformer 494, the oscillating output of which is applied to control SCR 402.

In operation of the power supply shown in FIGS. 5 and 6, the three phase A.C. signal is applied to terminals 350. Terminals 350 are sensed and applied through the six gating control channels in order to sequentially control the timing of the six SCRs 380 and 394–402 by means of oscillations. The gating of the SCRs 380 and 394–402 enables conversion from A.C. to D.C. and generates a desirable stable D.C. output suitable to drive the magnetic modulator of the present invention. The amplitude of the D.C. output may be regulated by control of the SCRs. The combination of the present magnetic modulator and the relatively inexpensive power supply of FIGS. 5 and 6 is made possible because the magnetic modulator does not require absolute grounding capability and can operate with a floating ground provided by the present power supply. The present power supply does not need expensive power and variable transformers commonly required in radar supply systems. For a further explanation of the operation of a typical three phase rectifier bridge circuit, reference is made to the *Silicon Controlled Rectifier Manual*, Second Edition, published by General Electric Company in 1961, Chapter 8 and *Silicon Rectifier Designers Handbook*, Robert Murray, Jr., Westinghouse Electric Corporation, Semiconductor Division, Youngwood, Pa., Apr. 30, 1964.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:
1. A system for reducing time and amplitude jitter in a stagger mode radar modulator comprising:
   a. a plurality of capacitors coupled in parallel and means for charging the plurality of capacitors;
   b. a plurality of trigger means, each of said plurality of trigger means operably coupled to the output of the plurality of capacitors and to a reference voltage, the reference voltage for each of the plurality of trigger means being of a different magnitude, whereby an output signal for each of said plurality of trigger means is produced only when the output of the plurality of capacitors exceeds the magnitude of the reference voltage;
   c. a corresponding plurality of electrical gates operably coupled to the plurality of trigger means;
   d. means synchronized with the stagger mode operation of said modulator for sequentially enabling said gates to open sequentially the plurality of trigger means; and
   e. means operably coupled to the outputs of said plurality of trigger means for preventing charging of the plurality of capacitors above a preselected level.

2. The system of claim 1 wherein each of said plurality of trigger means comprises a Schmidt trigger.

3. The system of claim 1 wherein each of said corresponding plurality of gates comprise a normally nonconductive transistor.

4. The system of claim 1 wherein said means for sequentially enabling said corresponding plurality of gates comprises a plurality of registers clocked responsive to reset trigger signals and to stagger modulator trigger signals.

5. The system of claim 1 wherein said means for preventing charging comprises a resistance connected to said capacitance by the operation of a switch controlled transformer.

* * * * *